(12) United States Patent
Donnenwirth et al.

(10) Patent No.: US 9,419,626 B2
(45) Date of Patent: Aug. 16, 2016

(54) DEVICE AND METHOD FOR ADJUSTING AN OSCILLATION FREQUENCY OF A VCTCXO OSCILLATOR

(71) Applicant: SAGEMCOM BROADBAND SAS, Rueil-Malmaison (FR)

(72) Inventors: Freddy Donnenwirth, Rueil-Malmaison (FR); Laurent Jourdain, Rueil-Malmaison (FR)

(73) Assignee: SAGEMCOM BROADBAND SAS, Rueil-Malmaison (FR)

( * ) Notice: Subject to any disclaimer, the term of this patent is extended or adjusted under 35 U.S.C. 154(b) by 0 days.

(21) Appl. No.: 14/891,299

(22) PCT Filed: May 13, 2014

(86) PCT No.: PCT/EP2014/059763
§ 371 (c)(1),
(2) Date: Nov. 13, 2015

(87) PCT Pub. No.: WO2014/184191
PCT Pub. Date: Nov. 20, 2014

(65) Prior Publication Data
US 2016/0087637 A1    Mar. 24, 2016

(30) Foreign Application Priority Data
May 15, 2013   (FR) ..................................... 13 54341

(51) Int. Cl.
*H03L 1/02*    (2006.01)
*H03L 7/00*    (2006.01)
(Continued)

(52) U.S. Cl.
CPC .. *H03L 1/02* (2013.01); *H03B 5/04* (2013.01); *H03B 5/32* (2013.01); *H03L 1/026* (2013.01); *H03L 1/028* (2013.01); *H03L 7/00* (2013.01)

(58) Field of Classification Search
CPC ............. H03L 1/00; H03L 1/02; H03L 1/026; H03L 1/028; H03B 5/04; H03B 5/36
See application file for complete search history.

(56) References Cited

U.S. PATENT DOCUMENTS

| | | |
|---|---|---|
| 5,113,416 A | 5/1992 | Lindell |
| 5,875,388 A | 2/1999 | Daughtry et al. |
| 7,010,307 B2 * | 3/2006 | Abraham ............... G01S 19/235 331/158 |

(Continued)

FOREIGN PATENT DOCUMENTS

EP    0 483 090    4/1992

OTHER PUBLICATIONS

International Search Report for PCT/EP2014/059763, mailed Jul. 1, 2014, three pages.

(Continued)

*Primary Examiner* — Ryan Johnson
(74) *Attorney, Agent, or Firm* — Nixon & Vanderhye P.C.

(57) ABSTRACT

A device (110), comprising a temperature sensor (111) accesses an external time or frequency reference (121; 130) for adjusting an oscillation frequency of a VCTCXO oscillator (113). The device determines a variation in the VCTCXO oscillator's ambient temperature over a predetermined time range thanks to measurements from the temperature sensor, and adjusts a frequency, or rate, of access to the external time or frequency reference in order to obtain time or respectively frequency information for adjusting the oscillation frequency of the VCTCXO oscillator, according to the determined variation in temperature.

13 Claims, 4 Drawing Sheets

(51) Int. Cl.
*H03B 5/32* (2006.01)
*H03B 5/04* (2006.01)

(56) References Cited

U.S. PATENT DOCUMENTS

| | | | |
|---|---|---|---|
| 7,720,469 B2* | 5/2010 | Kerstenbeck | H03L 1/02 370/257 |
| 7,915,962 B2* | 3/2011 | Nicholls | H03L 1/026 331/14 |
| 8,362,845 B2* | 1/2013 | Jackson | H03L 7/08 331/1 R |
| 2008/0218279 A1 | 9/2008 | Keating | |
| 2011/0187422 A1* | 8/2011 | Hammes | H03L 1/026 327/156 |

OTHER PUBLICATIONS

Written Opinion of the ISA for PCT/EP2014/059763, mailed Jul. 1, 2014, five pages.

* cited by examiner

DEVICE AND METHOD FOR ADJUSTING AN OSCILLATION FREQUENCY OF A VCTCXO OSCILLATOR

CROSS-REFERENCE TO RELATED APPLICATIONS

This application is the U.S. national phase of International Application No. PCT/EP2014/059763, filed 13 May 2014, which designated the U.S. and claims priority to FR 13/54341, filed 15 May 2013; the entire contents of each of which are hereby incorporated by reference.

BACKGROUND OF THE INVENTION

The present invention relates to an adjustment of an oscillating frequency of a voltage-controlled temperature-compensated oscillator thanks to an external time or frequency reference.

In order to be able to clock processing operations performed by a device, a voltage-controlled temperature-compensated oscillator VCTCXO can be used. This type of oscillator is found in many items of communication equipment.

In the mobile telephony world, a femtocell is a cell in a mobile telephony cell system offering limited radio coverage and generally dedicated to domestic use. The base station, referred to as a femto, responsible for managing the femtocell, connects to the network of the mobile telephony operator via an Internet gateway. Such femtos typically have an oscillator of the VCTCXO type.

When a device uses a VCTCXO oscillator, it may be necessary to have recourse to an external time or frequency reference in order to adjust the oscillation frequency of the oscillator and thus allow complying with the required frequency precision, e.g. +/−250 ppb (parts per billion). For example the NTP (Network Time Protocol, as defined in the standard documents RFC 1305 and RFC 5905) and PTP (Precision Time Protocol, as defined by the IEEE 1588 standard) protocols should be noted, enabling to synchronise the oscillation frequency of the oscillator thanks to an external time reference.

The frequency stability of a VCTCXO oscillator depends essentially on the variation in the ambient temperature around the oscillator and its ageing. The variations in ambient temperature may be rapid and considerable, e.g. several tens of degrees in less than one hour, and cause, over a period of one or two hours, the maximum variations in frequency provided for in the specifications of the oscillator. As for ageing, this causes smaller and slower variations in frequency, e.g. a few tens of ppb over several days, i.e. approximately 1 ppm (parts per million) over one year. The variations in frequency caused by the variations in ambient temperature are therefore the most difficult to correct in terms of frequency, or rate, of access to the external time or frequency reference.

In order to be able to ensure the required precision of the oscillator, it is usual to define the frequency, or rate, of access to the external time reference so as to be able to correct the most constraining predicted variations in frequency. This implies high data traffic between the device comprising the oscillator and the external time reference and reduces the maximum number of devices that a same time server can manage in parallel.

In order to limit the frequency, or rate, of access to the external time reference, it is known to use a VCTCXO oscillator that is sufficiently stable and/or pre-calibrated in terms of temperature so that exchanges with the time server acting as the external time reference are intended only for corrections due to the ageing of the oscillator. This approach does however pose a problem of manufacturing cost.

It is desirable to overcome the drawbacks of the prior art. It is in particular desirable to provide a solution that enables adjusting an oscillation frequency of a voltage-controlled and temperature-compensated oscillator thanks to an external time reference while preserving the network resources for accessing this external time reference, as well as the processing resources of the device implementing this external time reference.

It is in particular desirable to provide a solution that is simple to implement at low cost.

BRIEF SUMMARY OF THE INVENTION

The invention relates to a method for adjusting an oscillation frequency of a voltage-controlled and temperature-compensated oscillator of a device, said device accessing an external time or frequency reference in order to adjust the oscillation frequency of said oscillator according to time or respectively frequency information supplied by said external time reference. Said device comprises a temperature sensor and performs the following steps: determining a variation in ambient temperature of said oscillator over a predetermined time range thanks to measurements from said sensor; and adjusting a frequency, or a rate, of access to the external time or frequency reference so as to obtain said time or respectively frequency information for adjusting the oscillation frequency of said oscillator, according to the determined variation in temperature. Thus the device seeks access to the external time or frequency reference when the oscillation frequency of the oscillator is most liable to change, meaning when the ambient temperature of the oscillator varies.

According to a particular embodiment, thermal insulation being achieved thanks to a first cap covering said oscillator on a printed circuit board in which holes are provided around said oscillator and a second cap covering the opposite face of the printed circuit board, said device determines the variation in ambient temperature of said oscillator further on the basis of a transfer function of said thermal insulation. This arrangement causes a filtering of rapid variations in the ambient temperature of the oscillator, which limits the slope of the variations in the oscillation frequency of the oscillator and introduces a shift in time. The reduction in the slope of variation of the oscillation frequency of the oscillator has a direct influence on the frequency or rate of access to the external time or frequency reference.

According to a particular embodiment, the external time reference is implemented by a time server. Thus the adjustment of the oscillation frequency of the oscillator can easily be achieved through a communications network such as the Internet.

According to a particular embodiment, several levels of variation in ambient temperature of said oscillator being defined, each level being associated with at least one respective sliding window, each sliding window being associated with at least one ambient temperature variation threshold enabling passing from one level to another, each level further being associated with a frequency or rate of access to the external time reference, the device performs the following steps: determining whether the variation in ambient temperature on each sliding window of a first ambient temperature variation level passes one threshold associated with said sliding window; changing for a second level when said threshold is passed, and applying the frequency or rate of access to the external time frequency that is associated with said second level. The changes in frequency, or rate, of access to the external time reference then take place in plateaux, thus allowing to simply compensate for the inertia of the adjustment by the time server.

According to a particular embodiment, two sliding windows are defined per ambient temperature variation level. Thus the temperature variation peaks and the long-term temperature variations can be detected, and the appropriate correction of oscillation frequency of the oscillator can be made.

According to a particular embodiment, distinct ambient temperature variation levels of said oscillator are defined for a transient state and steady state of said device. Thus the rate of access to the external time reference can be reinforced for the transient state, where the heating of the electronic components implies abrupt variations in oscillation frequency of the oscillator.

According to a particular embodiment, when passing from the first level to the second level, the device transfers, to each sliding window of said second level, some of the ambient temperature variations detected during each sliding window of the first level. Thus the inertia of the adjustment by time server is compensated for at the change in level.

According to a particular embodiment, each ambient temperature variation level being associated with a precision of oscillation frequency of said oscillator, the device being a femto, the device performs the following steps: detecting a base station managing a cell adjacent to the femtocell managed by the femto with better precision than that of the ambient temperature variation level in which the device happens to be; awaiting an absence of communication in the femtocell, and then listening out for the base station in order to obtain the frequency information for adjusting the oscillation frequency of said oscillator. Thus, since monitoring adjacent cells monopolises the transmission/reception chain of the femto, the base station is used in assistance for the time server. Access, even sporadic, to the base station relieves accesses to the time server, since the inertia of the adjustment by time server is much greater than adjustment by base station.

According to a particular embodiment, the device selects said base station in order to adjust the oscillation frequency of said oscillator in each of the following cases: the difference between the determined ambient temperature variation and each ambient temperature variation threshold associated with the sliding window of the ambient temperature variation level in which the device happens to be is lower than a predefined margin; the precision of the base station is better than the precision corresponding to the lower level of ambient temperature variation compared with the ambient temperature variation level in which the device happens to be, and the ambient temperature variation determined is below a high threshold of temperature variation associated with the sliding window or windows of said lower level. This allows reducing the access rate to the external time reference while avoiding passing to a higher level, or accelerating passage to a lower level.

According to a particular embodiment, the device performs the following steps: translating the precision of the base station into a corresponding ambient temperature variation; and reinitialising each sliding window and adding said corresponding ambient temperature variation to each sliding window. Thus account is taken of the frequency error potentially introduced during the adjustment performed thanks to the base station.

According to a particular embodiment, said device being a femto, the external frequency reference is implemented by a base station managing a cell adjacent to the femtocell managed by the femto. Thus the adjustment is rapid.

The invention also relates to a device comprising a voltage-controlled and temperature-compensated oscillator, the device being adapted for accessing an external time or frequency reference and for adjusting the oscillation frequency of said oscillator according to time or respectively frequency information supplied by said external time or frequency reference. The device is such that it comprises: a sensor for the ambient temperature of the oscillator; means for determining a variation in ambient temperature of said oscillator over a predetermined time range thanks to measurements from said sensor; and means for adjusting a frequency, or rate, of access to the external time or frequency reference so as to obtain said time or respectively frequency information for adjusting the oscillation frequency of said oscillator, according to the determined temperature variation.

According to a particular embodiment, the device comprises a printed circuit in which holes are provided around said oscillator, a first cap covering said oscillator on the printed circuit board and a second cap covering the opposite face of the printed circuit board so as to produce thermal insulation, said device comprises means for determining the variation in ambient temperature of said oscillator thanks further to a transfer function of said thermal insulation.

The invention also relates to a computer program, which may be stored on a medium and/or downloaded from a communications network, in order to be read by a processor. This computer program comprises instructions for implementing the method mentioned above, when said program is executed by the processor. The invention also relates to storage means comprising such a computer program.

BRIEF DESCRIPTION OF THE DRAWINGS

The features of the invention mentioned above, as well as others, will emerge more clearly from a reading of the following description of an example embodiment, said description being given in relation to the accompanying drawings, among which.

DETAILED DESCRIPTION OF THE INVENTION

Figure 1A:
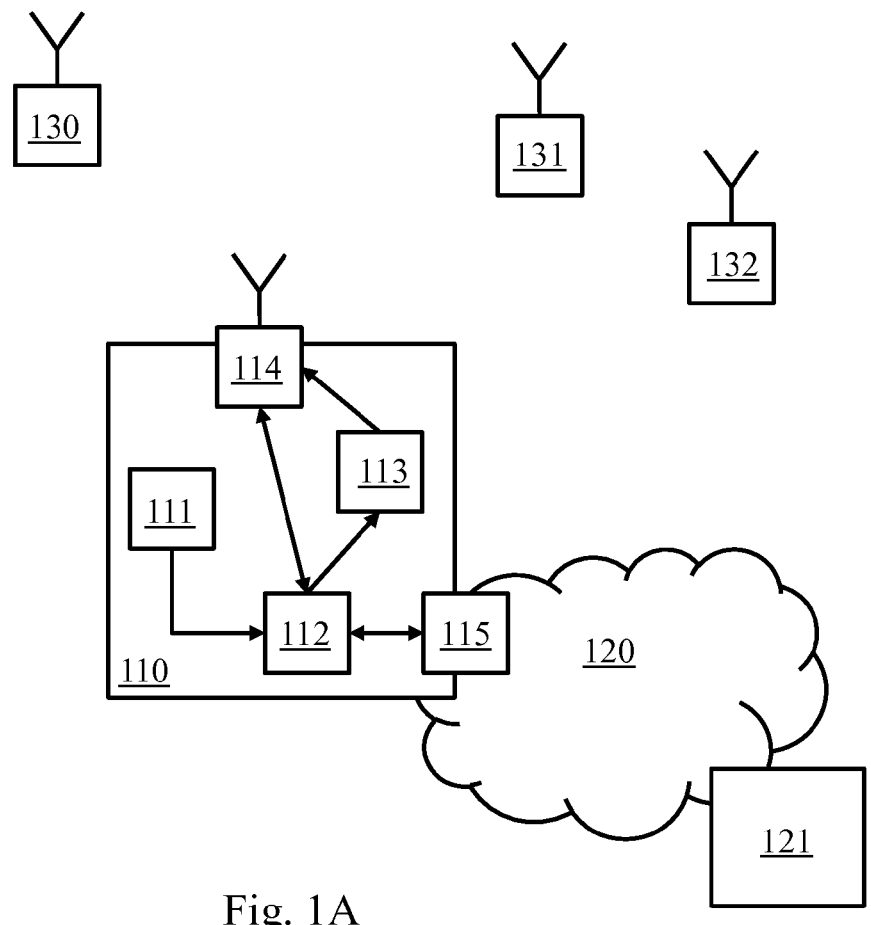
FIG. 1A schematically illustrates a communication system in which the present invention may be implemented.

FIG. 1A schematically illustrates a communication system in which the present invention may be implemented.

The communication system comprises a device 110 comprising a VCTCXO oscillator 113 for defining a system clock particular to the device 110, and therefore a system time particular to the device 110, and having at least one external time or frequency reference for adjusting this system time and the oscillation frequency of the VCTCXO oscillator 113. Such an external time or frequency reference may be implemented by a time server 121 and/or by a BTS (Base Transceiver Station) 130, as described hereinafter in relation to FIG. 3.

In the following description, the device 110 is more particularly a femto. However, implementation of the device is not limited to this context.

The femto 110 comprises a first communication interface 115 enabling the device 110 to exchange messages and data with the time server 121 via a communications network 120, such as the Internet. Such exchanges are based for example on use of the NTP protocol or the PTP protocol.

When the femto 110 uses the time server 121 for determining the offset of the system time of the femto 110, and therefore the oscillation frequency of the VCTCXO oscillator 113, with respect to the reference time of the server, each computation of this time offset is sensitive to the latency and jitter suffered by the messages transmitted via the communications network 120. The precision in computation of the frequency error therefore depends on the number of accesses made to the time server 121, and therefore on the frequency, or rate, of access to this time server 121. This involves a certain inertia in the adjustment, by time server, of the oscillation frequency of the VCTCXO oscillator 113.

The femto 110 comprises a second communication interface 114 enabling the device 110 to exchange messages and data with UE ("User Equipment") mobile equipment 131, 132, in the femtocell managed by the femto 110.

The second communication interface 114 is controlled by a clock derived from the VCTCXO oscillator 113. The VCTCXO oscillator 113 is voltage-controlled by a control module 112 of the femto 110. The control module 112 is further adapted for receiving measurement data for the ambient temperature of the VCTCXO oscillator 113 coming from a temperature sensor 111. In the context of FIG. 1A, the temperature sensor 111 is placed in the same housing as the VCTCXO oscillator 113 in order to measure the ambient temperature thereof.

Figure 1B:
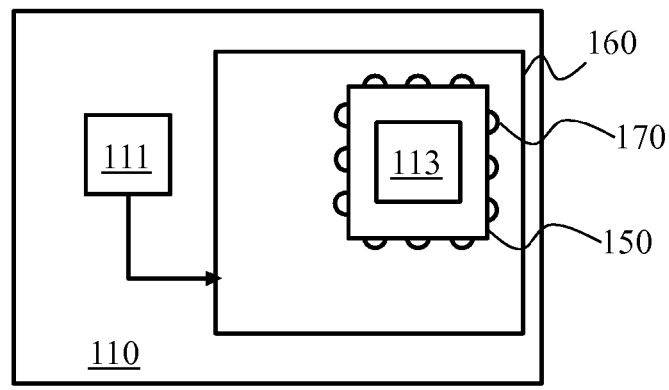
FIGS. 1B and 1C schematically illustrate an embodiment of a device of the communication system.
Figure 1C:

FIGS. 1B and 1C schematically illustrate an embodiment of the femto 110, in which a first cap 150 covers the VCTCXO oscillator 113 on a printed circuit board PCB 160 and a second cap 150 covers the opposite face of the printed circuit board. Holes 170 are preferentially provided in the printed circuit PCB around the VCTCXO oscillator 113 in order to insulate the VCTCXO oscillator 113 from the temperature variations of the printed circuit board PCB 160 caused by the other components of the femto 110. Such an arrangement behaves as a low-pass filter vis-à-vis variations in temperature. This implies a filtering of the rapid variations in temperature measured by the temperature sensor 110, with an offset in time and a reduction in the slope of such variations. Such an arrangement therefore has a thermal insulation effect. The transfer function of this thermal insulation being able to be known, e.g. empirically thanks to laboratory tests, it is possible to predict the variations in temperature inside the cap 150 around the VCTCXO oscillator 113.

As presented in FIGS. 1B and 1C, the holes 170 may be provided on the printed circuit board PCB so as to enable fixing the first 150 and second 151 caps on the printed circuit board PCB thanks to fixing elements passing through these holes 170.

Figure 2:
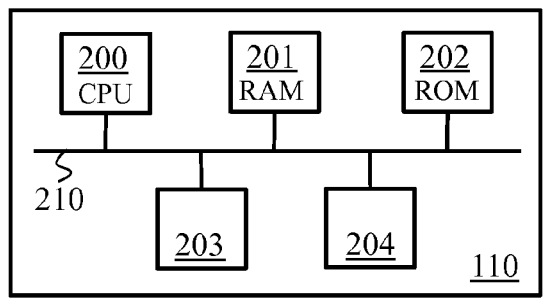
FIG. 2 schematically illustrates an example of hardware architecture of said device.

FIG. 2 schematically illustrates an example of hardware architecture of the femto 110. The femto 110 then comprises, connected by a communication bus 210: a processor or CPU (Central Processing Unit) 200; a random access memory RAM 201; a read only memory ROM 202; a storage unit or a storage medium reader, such as an SD (Secure Digital) card reader or a hard disc drive HDD 203; and a set of interfaces 204 consisting of the first 115 and second 114 communication interfaces. The VCTCXO oscillator 113 is for example implemented in the set of interfaces 204.

The processor 200 is capable of executing instructions loaded in the RAM 201 from the ROM 202, from an external memory (not shown), from a storage medium, or from a communications network. When the femto 110 is powered up, the processor 200 is capable of reading instructions from the RAM 201 and executing them. These instructions form a computer program causing the implementation, by the processor 200, of all or some of the algorithms and steps described hereafter. Thus all or some of the algorithms and steps described hereafter can be implemented in software form by execution of a set of instructions by a programmable machine, such as a DSP (Digital Signal Processor) or a microcontroller. All or some of the algorithms and steps described hereafter can also be implemented in hardware form by a machine or a dedicated component, such as an FPGA (Field-Programmable Gate Array) or an ASIC (Application-Specific Integrated Circuit).

Figure 3:
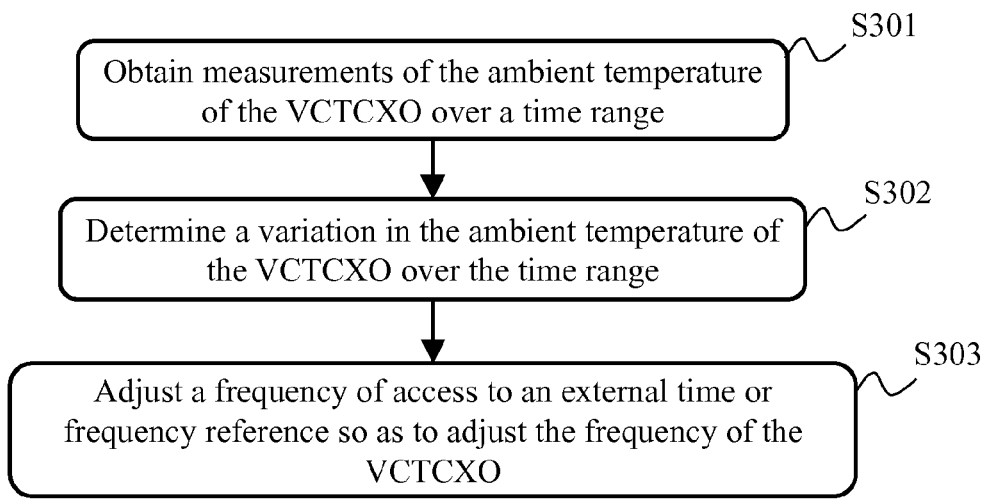
FIG. 3 schematically illustrates an algorithm for adjusting the oscillation frequency of a VCTCXO oscillator of said device.

FIG. 3 schematically illustrates an algorithm for adjusting the oscillation frequency of the VCTCXO oscillator 113.

In a step S301, the femto 110 obtains, coming from the temperature sensor 111, measurements of the ambient temperature of the oscillator VCTCXO 113 over a predetermined time range.

In a following step S302, the femto 110 determines a variation in the ambient temperature over the predetermined time range.

In a following step S303, the femto 110 adjusts the frequency, or rate, of access to the external time or frequency reference in order to adjust the oscillation frequency of the VCTCXO oscillator 113.

As already mentioned, the external time or frequency reference may be implemented by the time server 121 or by the base station BTS 130. As described below in relation to FIG. 5, the base station BTS 130 may also be used as assistance for a main synchronisation performed thanks to the time server 121.

When the external time reference is implemented by the time server 121, the femto 110 increases or decreases the frequency of access to the time server 121 in order to obtain time information. This enables the femto 110 to obtain a larger amount of time information from the time server 121 for the same time range when the ambient temperature conditions vary significantly, meaning that the femto 110 reduces the time necessary for integrating the time information received from the time server 121 to correct the frequency error of the oscillation of the VCTCXO oscillator 113. This enables the femto 110 to release the constraint on the time server 121 when the ambient temperature conditions stabilise or are stable.

When the external frequency reference is implemented by the base station BTS 130, the femto 110 increases or decreases the frequency of listening out for the BTS base station 130 in order to obtain frequency information. Refreshing of the oscillation frequency of the VCTCXO oscillator 113 is therefore more frequent when the ambient temperature conditions vary significantly, and less frequent when the ambient temperature conditions stabilise or are stable.

Figure 4:
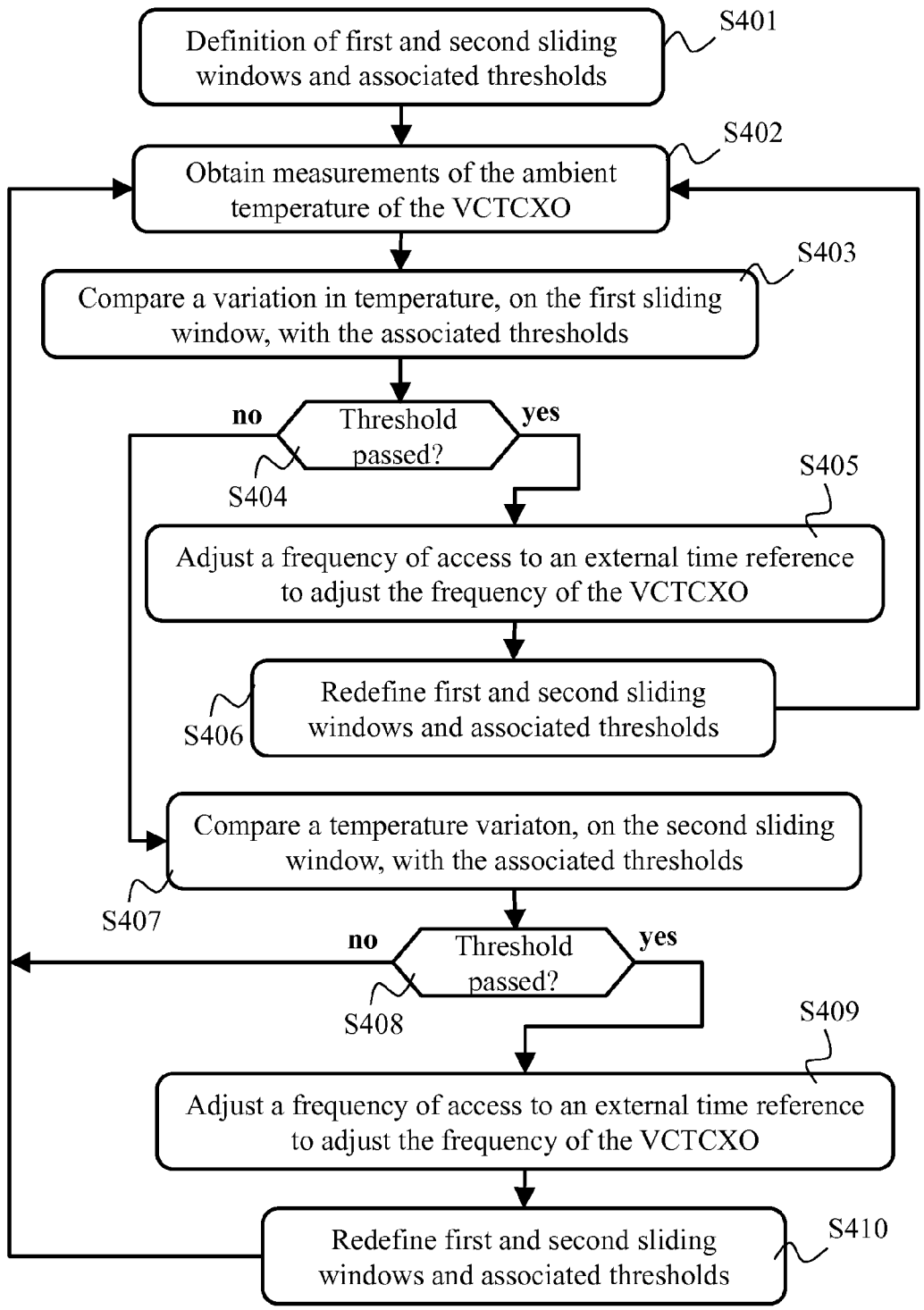
FIG. 4 schematically illustrates an algorithm for adjusting the oscillation frequency of the VCTCXO oscillator of said device, based on an implementation of sliding windows.

FIG. 4 schematically illustrates an algorithm for adjusting the oscillation frequency of the VCTCXO oscillator 113, based on an implementation of sliding windows. The algorithm in FIG. 4 is suitable for adjusting the oscillation frequency of the VCTCXO oscillator 113, by use of the time server 121.

In a step S401, the femto 110 defines first and second sliding windows, as well as associated respective temperature variation thresholds. Two thresholds are thus defined per sliding window, except when the minimum or maximum rates are reached (where only one threshold is useful). One of these thresholds (the high threshold) enables the femto 110 to decide to increase the frequency, or rate, of access to the external time reference (except when the maximum rate is reached), the other one of these thresholds (the low threshold) enabling the femto 110 to decide to decrease the frequency, or rate, of access to the external time reference (except when the minimum rate is reached). The first and second sliding windows are used in a complementary manner by the femto 110. The duration of the first window is longer than that of the second window and the high threshold of the first sliding window is strictly greater than that of the second sliding window. The first sliding window aims to adapt the frequency of access to the external time reference to slow variations in ambient temperature, whereas the second sliding window aims to adapt the frequency of access to the external time reference to the ambient temperature variation peaks. A single sliding window could thus be defined to adapt the frequency of access to the external time reference to the ambient temperature variations.

In a following step S402, the femto 110 obtains measurements of the ambient temperature of the VCTCXO oscillator 113. From these measurements, the femto 110 determines a variation in the ambient temperature of the VCTCXO oscillator 113 on each sliding window defined at the step S401.

In a following step S403, the femto 110 compares the variation in the ambient temperature of the VCTCXO oscillator 113 on the first sliding window with each temperature variation threshold (high and low) associated with said first sliding window.

In a following step S404, the femto 110 checks whether the variation in the ambient temperature of the VCTCXO oscillator 113 on the first sliding window exceeds one of the thresholds associated with said first sliding window. When the variation in the ambient temperature of the VCTCXO oscillator 113 on the first sliding window passes one of these thresholds, a step S405 is performed; otherwise a step S407 is performed.

In the step S405, the femto 110 adjusts the frequency, or the rate, of access to the external time reference, meaning to the time server 121, according to the variation in the ambient temperature of the VCTCXO oscillator 113 found on the first sliding window. In other words, when the variation in the ambient temperature shows that the ambient temperature of the VCTCXO oscillator 113 stabilises on the first sliding window, the femto 110 reduces the actions with regard to the external time reference; and when the variation in the ambient temperature accelerates on the first sliding window, the femto 110 increases the actions with the external time reference.

In a following step S406, the femto 110 consequently redefines the first and second sliding windows, as well as the associated respective temperature variation thresholds. To do this, the femto 110 may predefine a set of temperature variation levels. Each level i defines two high temperature variation thresholds $STL_i$ and $STS_i$, corresponding respectively to the first $FL_i$ and second $FS_i$ sliding windows of respective durations $tL_i$ and $tS_i$. Each level i also defines two low temperature variation thresholds $STL_i'$ and $STS_i'$ corresponding respectively to the first $FL_i$ and second $FS_i$ sliding windows. With each temperature variation level there is associated a rate of access $d_i$ to the time server 121 ensuring a minimum predefined frequency precision. The average rates of access $d_i$ to the time server 121 depend on the stability of the VCTCXO oscillator 113, the temperature thresholds $STL_i$ and $STS_i$, and the minimum precision required. To define the temperature thresholds $STL_i$, $STL_i'$, $STS_i$ and $STS_i'$, as well as the associated precision, it is possible to use the manufacturer specification for the VCTCXO oscillator 113, which gives maximum frequency variations for a given temperature variation. Different thresholds $STL_i$, $STL_i'$, $STS_i$ and $STS_i'$, as well as different durations $tL_i$ and $tS_i$, are therefore associated with the temperature variation levels. Thus, when the femto 110 performs the steps S405 and S406, the femto 110 is configured so as to pass from one level (i) to the other (i+1 or i−1 depending on the variation in the ambient temperature of the VCTCXO oscillator 113). The passage from a temperature variation level i to a greater variation level i+1 is accompanied by a definition of the sliding windows with shorter durations $tS_{i+1}$ and $tL_{i+1}$ and a higher frequency of access or rate of access $d_{i+1}$ to the external time reference. The passage from a temperature variation level i to a lower variation level i−1 is accompanied by a definition of the sliding windows with a greater duration $tS_{i-1}$ and $tL_{i-1}$ and a lower frequency of access or rate of access to the external time reference.

The low thresholds associated with the sliding windows may be defined relative to the high thresholds of the windows of lower level. For example, the low thresholds $STL_i'$ and $STS_i'$ are defined as follows:

$$STL_i' = STL_{i-1} - HL_{i-1} \text{ with } HL_{i-1} = STL_{i-1}/4$$

$$STS_i' = STS_{i-1} - HS_{i-1} \text{ with } HS_{i-1} = STS_{i-1}/3$$

where $HL_{i-1}$ and $HS_{i-1}$ represent hysteresis values.

Let us take the example described in the following table, which is typical of a steady state, where four ambient temperature variation levels of the VCTCXO oscillator 113 are defined and the thresholds $STL_i'$ and $STS_i'$ are respectively defined relative to the thresholds $STL_{i-1}$ and $STS_{i-1}$ as in the above example:

TABLE 1

| Windows and thresholds | Precision | Access rate |
|---|---|---|
| $FL_0$: first sliding window of duration $tL_0$ = 6 h<br>$STL_0$: threshold at 6° C. for window $FL_0$<br>$FS_0$: second sliding window of duration $tS_0$ = 2 h<br>$STS_0$: threshold at 4° C. for window $FS_0$ | 125 ppb | $d_0$ |
| $FL_1$: first sliding window of duration $tL_1$ = 4 h<br>$STL_1$: threshold at 9° C. for window $FL_1$<br>$FS_1$: second sliding window of duration $tS_1$ = 1.35 h<br>$STS_1$: threshold at 6° C. for window $FS_1$ | 125 ppb | $d_1$ = 2.2 $d_0$ |
| $FL_2$: first sliding window of duration $tL_2$ = 2 h<br>$STL_2$: threshold at 12° C. for window $FL_2$<br>$FS_2$: second sliding window of duration $tS_2$ = 0.65 h<br>$STS_2$: threshold at 8° C. for window $FS_2$ | 150 ppb | $d_2$ = 5 $d_0$ |
| $FL_3$: first sliding window of duration $tL_3$ = 1 h<br>$STL_3$: threshold at 24° C. for window $FL_3$<br>$FS_3$: second sliding window of duration $tS_3$ = 0.25 h<br>$STS_3$: threshold at 10° C. for window $FS_3$ | 250 ppb | $d_3$ = 20 $d_0$ |

The thresholds $STL_i$ and $STS_i$ may be defined according to predictable climatic environment conditions of the femto 110. Indeed the possibilities of variation in the ambient temperature of the VCTCXO oscillator 113 are different when the femto 110 is in a temperature environment that is globally regulated for temperature or not.

The rate $d_0$ shall for example allow maintaining a precision of 125 ppb with a maximum variation of ambient temperature of the VCTCXO oscillator 113 of 6° C. over a sliding window of 6 hours and a maximum variation of 4° C. over a sliding window of 2 hours.

Taking a value of 25 ppb as the resolution of the synchronisation system by the time server 121, the rate $d_0$ shall be chosen so that it allows correcting a temperature step of 4° C., the speed of variation in temperature being maximum. This by keeping the frequency error caused by this temperature step at less than 100 ppb and cancelling out this frequency error after a time $2.tS_0=4$ hours. This principle can be applied in a similar manner to the other rates $d_i$.

In a particular embodiment, when passing from one variation level to another, the femto 110 reinitialises the computation of the temperature variation by adding in the measurement windows $FL_{i+1}(j)$ and $FS_{i+1}(j)$ (or $FL_{i-1}(j)$ and $FS_{i-1}(j)$ according to the direction of change in level), where j is a time index on the sliding windows, some of the variations of the previous measurement windows $FL_i(j-1)$ and $FS_i(j-1)$, which corresponding variations in oscillation frequency of the VCTCXO oscillator 113 are not corrected.

The computation of the additions of temperature variation to the reinitialisation is based on the fact that a variation in oscillation frequency of the VCTCXO oscillator 113 is corrected at the end of a maximum period of $2.tS_i$ with a rate $d_i$. Thus, considering a change in level starting from a level i to a level i+1:

Temperature variations prior to time $t_0-2.tS_i$ are ignored, where t0 represents the moment of passage from one level to another;

The variations in the oscillation frequency of the VCTCXO oscillator 113 between times $t_0-2.tS_i$ and $t_0-(3.tS_i/2)$ are corrected to three-quarters at time $t_0$. The temperature variation addition to be taken into account at the time of reinitialisation is then equal to $¼.\Delta TS_{i,3}$, where $\Delta TS_{i,3}$ represents the ambient temperature variation in the time window ranging from $t_0-2.tS_i$ to $t_0-(3.tS_i/2)$;

The variations in the oscillation frequency of the VCTCXO oscillator 113 between times $t_0-(3.tS_i/2)$ and $t_0-tS_i$ are corrected by half at time $t_0$. The temperature variation addition to be taken into account at the time of reinitialisation is then equal to $½.\Delta TS_{i,2}$, where $\Delta TS_{i,2}$ is the ambient temperature variation in the time window ranging from $t_0-(3.tS_i/2)$ to $t_0-tS_i$; and The variations in the oscillation frequency of the VCTCXO oscillator 113 between times $t_0-tS_i$ and $t_0-tS_i/2$ are corrected by one quarter at time $t_0$. The temperature variation addition to be taken into account at the time of reinitialisation is then equal to $¾.\Delta TS_{i,1}$, where $\Delta TS_{i,1}$ represents the ambient temperature variation in the time window ranging from $t0-tS_i$ to $t_0-tS_i/2$.

The variations in temperature after the change in level are then:

In the window $FL_{i+1}$, for the range from $t_0$ to $t_0+(2.tS_i-tL_{i+1})$, the corrected variation in ambient temperature is equal to the temperature variation measured over the window $FL_{i+1}$ to which $¼.\Delta TL_{i,i+1}$ is added, where $\Delta TL_{i,i+1}$ represents the variation in ambient temperature in the time window ranging from $t_0-tL_{i+1}$ to $t_0-tS_i$; and In the window $FS_{i+1}$, the corrected variation in ambient temperature is equal to the temperature variation measured over the window $FS_{i+1}$ to which $¼.\Delta TS_{i,3}+½.\Delta TS_{i,2}+¾.\Delta TS_{i,1}$ is added for the range from $t_0$ to $t_0+tS_{i+1}$, and to which $⅜.\Delta TS_{i,1}$ is added for the time range from $t_0+tS_{i+1}$ to $t_0+2.tS_i$.

Thus the femto 110 transfers to each sliding window of level i+1 a part of the ambient temperature variations detected during the sliding window or windows of level i.

In a particular embodiment, when the femto 110 determines whether the variations in ambient temperature pass the low threshold $STS_i'$, the femto 110 adds, to the temperature variations measured in the sliding window $FS_i$, the temperature variations measured in the sliding window part $FS_{i-1}$ ranging from $t_0'-tS_i$ to $t_0'-tS_{i-1}$ by applying a weighting thereto, for example a factor of 0.5, where $t_0'$ represents the end time of the sliding window in question. Likewise, when the femto determines whether the ambient temperature variations pass the low threshold $STL_i'$, the femto 110 adds to the temperature variations measured in the sliding window $FL_i$ the temperature variations measured in the sliding window part $FL_{i-1}$ ranging from $t_0'-tL_i$ to $t_0'-tL_{i-1}$ by applying thereto a weighting, for example a factor of 0.35.

When step S406 is performed, step S402 is repeated with the newly-applicable sliding window parameters.

In the step S407, the femto 110 performs, for the second sliding window, the same operation as in step the S403 for the first sliding window. The femto 110 then compares the variation in the ambient temperature of the VCTCXO oscillator 113 on the second sliding window with each temperature variation threshold (high and low) associated with said second sliding window.

In the following step S408, the femto 110 checks whether the variation in the ambient temperature of the VCTCXO oscillator 113 on the second sliding window exceeds one of the thresholds associated with said second sliding window. When the variation in the ambient temperature of the VCTCXO oscillator 113 on the second sliding window passes one of these thresholds, a step S409 is performed; otherwise the step S402 is repeated, the sliding window parameters being kept.

In the step S409, the femto 110 adjusts the frequency, or rate, of access to the external time reference, meaning to the time server 121, according to the variation in the ambient temperature of the VCTCXO oscillator 113 observed on the second sliding window. In other words, when the variation in the ambient temperature shows that the ambient temperature of the VCTCXO oscillator 113 is stabilised on the second sliding window, the femto 110 reduces the actions with regard to the external time reference; and, when the variation in the ambient temperature accelerates on the second sliding window, the femto 110 increases the actions with regard to the external time reference.

It should be noted that the algorithm in FIG. 4 may be modified in order to make the comparisons of the steps S403 and S407 in the same step.

Figure 5:
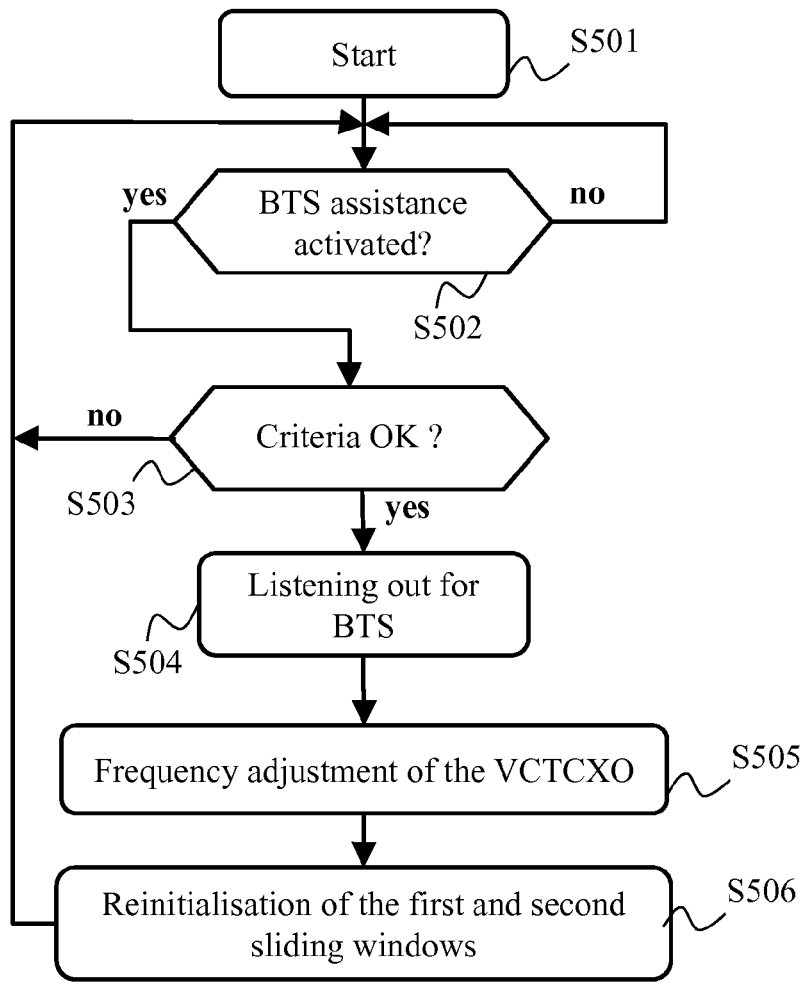
FIG. 5 schematically illustrates a supplementary algorithm for adjusting the oscillation frequency of a VCTCXO oscillator of said device, based on synchronisation with a base station.

FIG. 5 schematically illustrates a supplementary algorithm for adjusting the oscillation frequency of the VCTCXO oscillator 113, based on a synchronisation with a base station BTS, for example the base station BTS 130. The external time or frequency reference is then mainly implemented by the time server 121, the BTS base station 130 providing assistance for adjusting the oscillation frequency of the VCTCXO oscillator 113 so as to relieve accesses to the time server 121 as an external time reference.

The algorithm starts in a step S501. In a following step S502, the femto 110 checks whether the assistance by the base station BTS is activated.

Considering that the second communication interface 114 of the femto 110 comprises only one transmission/reception chain, the assistance by base station BTS is activated only during intervals of time without communications between the femto 110 and the UEs mobile equipment 131, 132. Indeed, as will be seen hereafter, the assistance by the base station BTS 130 involves the femto 110 listening out for adjacent cells, which requires blocking of any radio transmission and which, depending on the duration and frequency of such blocking, may cause leaving of the UEs mobile equipment 131, 132, as well as failures to initiate or receive communications. Preferentially, the duration of the listening out for the adjacent cells made for a synchronisation is limited typically to around one second, relying on a prior complete listening out for the adjacent cells performed regularly (typically once per day and at the powering up of the femto 110). This complete listening out enables establish a list of the base stations BTS with their power level, frequency and precision. The complete listening out may however last for a few minutes since all the frequencies are listened out and a certain number of priorities coming from the base stations BTS are decoded and/or analysed (such as their respective identifiers, the content of the CPICH channel (common pilot channel) etc.). Since the complete listening out is constraining with regard to its duration, it is preferentially performed solely at moments when such complete listening out interferes as little as possible (in the night with the absence of communications for example).

The base stations BTS used for the synchronisation are 2G and 3G base stations BTS. Such base stations BTS may be divided into three precision classes: 50 ppb, 100 ppb and 250 ppb. The question is then to favour the base stations BTS of precision 50 ppb and reject those of precision 250 ppb. It should be noted that the 2G and 3G base stations BTS can be distinguished from each other by virtue of their transmission frequency.

2G base stations BTS have two precision classes: 100 ppb for Pico and Micro base stations BTS, and 50 ppb for the other 2G base stations BTS. However, the precision classes may be difficult to identify when listening out for the cells. All the 2G BTSs may then preferentially be classed as BTSs of 100 ppb precision.

3G base stations BTS have three precision classes: 250 ppb for home base stations HBS of which the femto 110 forms part, 100 ppb for so-called local area base stations BTS and for so-called medium range base stations BTS, and 50 ppb for so-called wide area base stations BTS. 3G base stations BTS transmit the information on the maximum power of the CPICH channel, the levels of which are different for the three precision classes of 3G base stations BTS. This information can be decoded when listening out for the cells. The home base stations HBS shall be rejected. Thus, if the maximum power of the CPICH channel is less than or equal to 10 dBm, it is likely that the base station BTS is a femto. This base station BTS shall then be rejected with regard to assistance with synchronisation. Likewise, if the maximum power of the CPICH channel is greater than 28 dBm, the base station BTS may be considered to be a so-called wide area base station BTS with a precision of less than 50 ppb and shall therefore be favoured. In all the other cases, the precision to be taken into account is 100 ppb. It should be noted that the base stations thus classified with a precision of 100 ppb may be 2G base stations BTS of precision 50 ppb, or may also be so-called wide area 3G base stations BTS of precision 50 ppb. Indeed, the maximum powers of the CPICH channel of the various classes of 3G base stations BTS are only specified by their upper limit (<10 dBm for base stations BTS of precision 250 ppb, <28 dBm for base stations BTS of precision 100 ppb and no upper limit for base stations BTS of precision 50 ppb).

Another criterion for activation of assistance by base station BTS is then the detection of at least a 2G or 3G base station BTS with a precision of 50 ppb or 100 ppb during the complete listening out for the adjacent cells.

Other criteria may be used to activate or not assistance by base station BTS, such as for example: a minimum interval of time between two activations of assistance by base station BTS, no UE mobile equipment connected to the femto 110, possible activation during a predefined interval of time such as during the night, etc. In addition, considering the levels of variation in ambient temperature defined in relation to FIG. 4, as long as the variation in the ambient temperature of the VCTCXO oscillator 113 is contained in the lowest level of variation in ambient temperature, the rate of access to the time server 121 is the lowest ($d_0$) and the assistance by base station BTS is not necessary and is then deactivated.

If assistance by base station BTS is activated, a step S503 is performed; otherwise the step S502 is repeated.

In the step S503, the femto 110 checks whether one or more synchronisation criteria by virtue of the assistance of a base station BTS are fulfilled. These criteria are preferably among the following:

a) the precision of at least one base station BTS detected during the complete listening out for the adjacent cells is better than the precision corresponding to the level i of variation in ambient temperature in which the femto 110 happens to be, and the difference between the variation in ambient temperature and one of the high thresholds defined for said level i is less than a predefined margin;

b) the precision of at least one base station BTS detected during the complete listening out for the adjacent cells is better than the precision corresponding to the level i−1 of variation in ambient temperature (and therefore also than the precision corresponding to the level i), the femto 110 happening to be in the level i of variation in ambient temperature, and the variation in temperature is below the high thresholds of variation in temperature corresponding to the sliding windows of level i−1;

c) the precision of at least one base station BTS detected during the complete listening out for the adjacent cells is significantly better than the precision corresponding to the level i of variation in ambient temperature in which the femto 110 happens to be.

Case a) allows maintaining the rate of access to the current time server. The margin allows for the criteria for activation of the assistance by base station BTS to have more chance of being met before the threshold in question is reached. Case b) allows passing to a lower rate of access (to the external time reference implemented by the time server 121), by reducing a waiting time related to hysteresis. Case c) allows passing to a lower access rate (to the external time reference implemented by the time server 121).

When the criterion or criteria is or are fulfilled, a step S504 is performed; otherwise the S502 is repeated.

In step the S504, the femto 110 listens out for the base stations BTS in the list established during the complete listening out, corresponding to the criteria of the step S503 and enabling complementing the synchronisation performed thanks to the time server 121.

The synchronisation listening out thus preferentially concerns only the base stations meeting the synchronisation criteria of the step S503 and, during this listening out, it is mainly the difference in frequency with the base station or stations that is measured thanks to the reception chain of the femto 110. This simplified synchronisation listening out allows reducing the listening out period typically to around one second. To reduce the probability of measuring a frequency with an extreme error (close to 100 ppb) in the case of synchronisation with a base station BTS classified with a precision of 100 ppb, the femto 110 may perform a weighted mean on the measured errors in frequency, when several base stations BTS of precision 100 ppb are detected. The weighting increases with the power of the CPICH channel of the 3G base stations BTS when this power of the CPICH channel is greater than 30 dBm, the probability of being in the presence of a so-called wide area base station BTS and therefore with a precision of 50 ppb increasing with the power of the CPICH channel.

In step the S505, the femto 110 adjusts the oscillation frequency of the VCTCXO oscillator 113 thanks to the mean frequency difference measured with the base station or stations BTS during the step S504.

In a following step S506, the femto 110 reinitialises the first and second sliding windows.

In a particular embodiment, an initial variation in temperature taking into account the maximum frequency error of the base station BTS that was used for updating the oscillation frequency of the VCTCXO oscillator 113 is added to the measured variations in ambient temperature. To do this, the femto 110 translates the precision of the base station BTS that was used for updating the oscillation frequency of the VCTCXO oscillator 113 into a corresponding ambient temperature variation, and the femto 110 adds this temperature variation to the variations in ambient temperature measured on the first (in sequence) sliding windows FLi and FSi after the synchronisation assisted by said base station BTS.

Once the step S506 has been performed, the step S502 is repeated.

Figure 6:
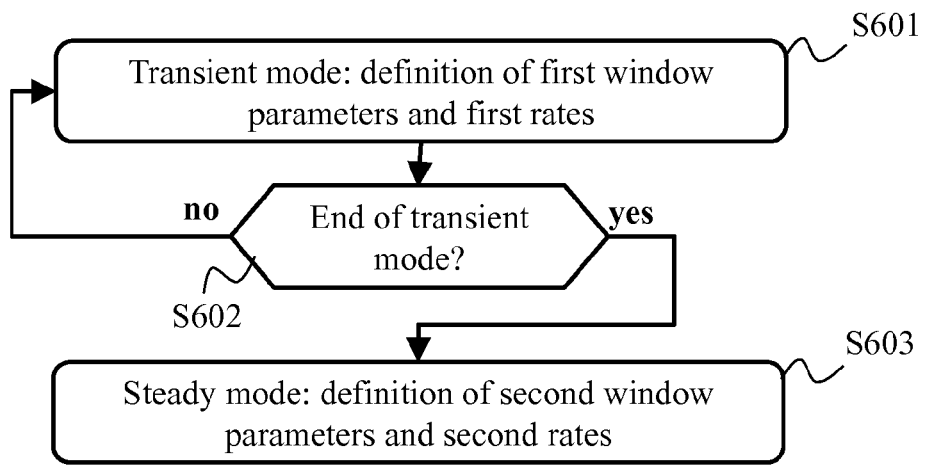
FIG. 6 schematically illustrates an algorithm for defining said sliding windows, depending on whether said device is in a transient state or a steady state.

FIG. 6 schematically illustrates an algorithm for defining the sliding windows, depending on whether the femto 110 is in transient mode or steady mode. The transient mode corresponds to the heating of the electronic components of the femto 110, for example following the powering up of the femto 110.

In transient mode, the variations in the ambient temperature of the VCTCXO oscillator 113 are caused by:
- the heating of the components of the femto 110, which may cause high variations in ambient temperature of the VCTCXO oscillator 113, for example 25° C. over a period of 15 minutes; and/or
- the variation in the ambient temperature external to the femto 110, which may cause for example a maximum of 20° C. of a variation in ambient temperature of the VCTCXO oscillator 113 over a period of one hour; and/or
- the establishment or dropping of a communication or change in radio power, which in general causes variations in ambient temperature of the VCTCXO oscillator 113 of small amplitude (typically a few degrees Celsius over 10 or 20 minutes).

In steady mode, the variations in ambient temperature of the VCTCXO oscillator 113 corresponds to those indicated above in transient mode without the variations caused by the heating of the components.

Since the corresponding variations in oscillation frequency of the VCTCXO oscillator 113 are much lower in steady mode (compared with transient mode), the mean access rates to the time server 121 are also much lower in steady mode (compared with transient mode).

In a step S601, the femto 110 is in transient mode, for example just after the powering up of the femto 110. The femto 110 then uses first frequencies, or first rates, of access to the external time or frequency reference.

In a step S602, the femto 110 checks whether the end of transient mode has been reached. According to a first example, the end of the transient mode is considered to be reached when a period of predefined duration has elapsed since the triggering of the transient mode, e.g. the powering up of the femto 110. According to a second example, the end of the transient mode is considered to be reached when the ambient temperature of the VCTCXO oscillator 113 is substantially stable.

When the end of the transient mode has been reached, a step S603 is performed; otherwise the parameters of the transient mode are maintained and the step S601 is repeated.

In the step S603, the femto 110 is in steady mode, the rise in temperature of the components being considered to have ended. The femto 110 then uses second frequencies, or second rates, of access to the external time or frequency reference.

The frequencies of access to the external time or frequency reference are greater in transient mode. Moreover, when the levels of variation in ambient temperature presented in FIG. 4 are used, the thresholds and durations of the sliding windows differ between transient mode and steady mode in order to be suited to more rapid variations and greater amplitudes in transient mode compared with steady mode. Thus, for the highest level $i_m$ of temperature variation, the rate of access $d_{imt}$ to the time server 121 is for example three times higher in transient mode than in steady mode, and the duration of the sliding windows is in transient mode one third of that in steady mode (the high temperature threshold being able to remain identical). In transient mode an intermediate level $i_{mt}-1$ of variation in temperature may be defined with a lower access rate $d_{imt-1}$, corresponding to small variations in ambient temperature external to the femto 110. Finally, in transient mode, a temperature level with an appreciably lower access rate $d_{imt-2}$ may be defined in the case of assistance with synchronisation by a base station BTS. In order to be able to correct the variations in frequency in transient mode using the access rate $d_{imt-2}$, the assistance with synchronisation by base station BTS is necessary and the frequency of listening out for the base stations BTS shall be higher than in steady mode in order to maintain the access rate $d_{imt-2}$ as long as possible, such as for example listening out every 3 or 4 minutes. It is then necessary to broaden the criteria for activation of the synchronisation assistance by base station BTS, for example by reducing the time interval between two listenings out for base stations BTS.

It should be noted that the example in table 1 gives parameters of sliding windows and rates of access to the time server 121 that are typical with a steady mode.

The algorithm in FIG. 6 allows reducing the time for bringing the femto 110 into service, following a reboot or a powering up of the femto 110, by enabling correcting the variations in frequency of the VCTCXO oscillator 113 in transient mode whilst optimising the mean rate of access to the time server 121.

The invention claimed is:

1. A method for adjusting an oscillation frequency of a voltage-controlled and temperature-compensated oscillator of a device, said device accessing an external time or frequency reference to adjust the oscillation frequency of said oscillator according to time or respectively frequency information supplied by said external time reference, wherein said device comprises a temperature sensor and performs:
   determining a variation in ambient temperature of said oscillator over a predetermined time range on the basis of measurements by said sensor; and
   adjusting a frequency, or a rate, of access to the external time or frequency reference so as to obtain said time or respectively frequency information for adjusting the oscillation frequency of said oscillator, according to the determined variation in temperature.

2. The method according to claim 1, wherein thermal insulation is achieved on the basis of a first cap covering said oscillator on a printed circuit board in which holes are provided around said oscillator and a second cap covering the opposite face of the printed circuit board, and said device determines the variation in ambient temperature of said oscillator further on the basis of a transfer function of said thermal insulation.

3. The method according to claim 1, wherein the external time reference is implemented by a time server.

4. The method according to claim 3, wherein, several levels of variation in ambient temperature of said oscillator being defined, each level being associated with at least one respective sliding window, each sliding window being associated with at least one ambient temperature variation threshold enabling passing from one level to another, each level further being associated with a frequency or rate of access to the external time reference, the device performs:
- determining whether the variation in ambient temperature on each sliding window of a first ambient temperature variation level passes one threshold associated with said sliding window;
- changing for a second level when said threshold is passed, and applying the frequency or rate of access to the external time reference that is associated with said second level.

5. The method according to claim 4, wherein two sliding windows are defined per ambient temperature variation level.

6. The method according to claim 4, wherein separate levels of variation in ambient temperature of said oscillator are defined for a transient mode and a steady mode of said device.

7. The method according to claim 4, wherein, when passing from the first level to the second level, the device transfers to each sliding window of said second level some of the ambient temperature variations detected during each sliding window of the first level.

8. The method according to claim 4, wherein, each ambient temperature variation level being associated with a precision of oscillation frequency of said oscillator, the device being a femto managing a femtocell, the device performs:
- detecting a base station managing a cell adjacent to the femtocell managed by the femto with better precision than that of the ambient temperature variation level in which the device happens to be;
- awaiting an absence of communication in the femtocell, and then listening out for the base station so as to obtain the frequency information for adjusting the oscillation frequency of said oscillator.

9. The method according to claim 8, wherein the device selects said base station so as to adjust the oscillation frequency of said oscillator in each of the following cases:
- the difference between the determined ambient temperature variation and each ambient temperature variation threshold associated with the sliding window of the ambient temperature variation level in which the device happens to be is lower than a predefined margin;
- the precision of the base station is better than the precision corresponding to the lower level of ambient temperature variation compared with the ambient temperature variation level in which the device happens to be, and the determined ambient temperature variation is below a high threshold of temperature variation associated with the sliding window or windows of said lower level.

10. The method according to claim 8, wherein the device performs:
- translating the precision of the base station into a corresponding variation in ambient temperature; and
- reinitialising each sliding window and adding to each sliding window said corresponding variation in ambient temperature.

11. The method according to claim 1, wherein, said device being a managing a femtocell, the external frequency reference is implemented by a base station managing a cell adjacent to the femtocell managed by the femto.

12. A device comprising a voltage-control and temperature-compensated oscillator, the device being configured for accessing an external time or frequency reference and for adjusting the oscillation frequency of said oscillator according to time or respectively frequency information supplied by said external time or frequency reference, wherein the device comprises:
- a sensor for the ambient temperature of the oscillator;
- and wherein the device is further configured for:
- determining a variation in ambient temperature of said oscillator over a predetermined time range on the basis of measurements by said sensor; and
- adjusting a frequency, or rate, of access to the external time or frequency reference so as to obtain said time or respectively frequency information for adjusting the oscillation frequency of said oscillator, according to the determined variation in temperature.

13. The device according to claim 12, wherein it comprises a printed circuit board in which holes are provided around said oscillator, a first cap covering said oscillator on the printed circuit board and a second cap covering the opposite face of the printed circuit board so as to produce thermal insulation, said device is configured for determining the variation in ambient temperature of said oscillator further on the basis of a transfer function of said thermal insulation.

* * * * *